United States Patent [19]

Perlegos et al.

[11] 4,103,189
[45] Jul. 25, 1978

[54] MOS BUFFER CIRCUIT

[75] Inventors: George Perlegos, Santa Clara; Phillip J. Salsbury, Sunnyvale, both of Calif.

[73] Assignee: Intel Corporation, Santa Clara, Calif.

[21] Appl. No.: 818,447

[22] Filed: Jul. 25, 1977

Related U.S. Application Data

[62] Division of Ser. No. 728,789, Oct. 1, 1976.

[51] Int. Cl.² .................. H03K 3/353; H03K 19/08; H03K 19/40
[52] U.S. Cl. .................. 307/270; 307/205; 307/304; 307/DIG. 1; 307/DIG. 5
[58] Field of Search ............ 307/205, 238, 264, 270, 307/304, DIG. 1, DIG. 4, DIG. 5

[56] References Cited

U.S. PATENT DOCUMENTS

| 3,700,981 | 10/1972 | Masuhara et al. | 307/205 X |
| 3,778,784 | 12/1973 | Karp et al. | 307/DIG. 1 X |
| 3,824,564 | 7/1974 | Wegener | 307/238 X |
| 3,895,360 | 7/1975 | Cricchi et al. | 307/DIG. 1 X |
| 3,938,108 | 2/1976 | Salsbury et al. | 307/DIG. 1 X |
| 3,940,747 | 2/1976 | Kuo et al. | 307/DIG. 1 X |
| 3,946,369 | 3/1976 | Pashley | 307/238 X |
| 3,959,781 | 5/1976 | Mehta et al. | 307/DIG. 5 X |
| 3,969,633 | 7/1976 | Paluck et al. | 307/205 |
| 4,021,656 | 5/1977 | Caudel et al. | 307/DIG. 1 X |
| 4,042,839 | 8/1977 | Araki | 307/205 X |

OTHER PUBLICATIONS

Dansky, "Multiple Threshold IGFET Ternary Circuits," IBM Tech. Discl. Bull.; vol. 17, No. 5, pp. 1356-1357, 10/1974.
Hayashi et al., "Design of ED-MOS Buffer," Electronics and Communications in Japan, (pub.), vol. 55-c, No. 10; 10/1972; pp. 107-114.
Kuo et al., "16K RAM Built With Proven Process May Offer High Start-Up Reliability," Electronics, (Pub.); pp. 81-86; 5/13/1976.

Primary Examiner—Larry N. Anagnos
Attorney, Agent, or Firm—Blakely, Sokoloff, Taylor & Zafman

[57] ABSTRACT

An MOS buffer circuit which may be employed as part of a electrically programmable read-only memory or other MOS integrated circuit is described. The buffer may be "powered down" when the memory is in a standby mode. Low threshold (zero threshold) voltage devices are employed in the circuit along with depletion mode transistors and enhancement mode transistors in a manner which permits the buffer to be readily powered down.

3 Claims, 4 Drawing Figures

MOS BUFFER CIRCUIT

This is a division of application Ser. No. 728,789, filed Oct. 1, 1976.

BACKGROUND OF THE INVENTION

1. Field of the Invention

The invention relates to the field of MOS buffers.

2. Prior Art

Numerous metal-oxide-semiconductor (MOS) digital buffer circuits are well-known and currently implemented in many MOS integrated circuits. Where these buffer circuits are employed to provide an output signal from an integrated circuit, a relatively large voltage swing is desirable along with high power, and the required speed. In order for these buffer circuits to provide this performance for typical p-channel and n-channel MOS circuits, they consume power when their output is in the high state and in the low state.

Several circuits are used to reduce this consumption of power when the buffer is not in use. In one commercial memory, for example, a clock power supply is employed which removes the power from the output buffer circuits. This most often requires external circuitry since it is difficult to provide "on chip" switching of power supply potentials.

With the invented buffer, a powered down mode without external switching of power supply potentials is obtained. Low threshold (zero threshold) voltage devices are employed to power down the output buffers without substantially effecting the operating performance of the buffer circuits.

SUMMARY OF THE INVENTION

An MOS buffer circuit is described. The buffer includes at least one stage having an enhancement mode transistor, a first depletion mode transistor and a second depletion mode transistor coupled in series. The second depletion mode transistor has a threshold voltage closer to ground potential than the threshold voltage of the first depletion mode transistor. The buffer includes an output transistor which has its gate coupled to the first and second depletion mode transistors. The buffer circuit may be readily powered down without effecting the performance of the buffer by applying a control signal to the gate of the second depletion mode transistor. Moreover, the output transistor, because of the low threshold voltages of the second depletion mode transistor, is bootstrapped.

DETAILED DESCRIPTION OF THE INVENTION

An electrically programmable, integrated circuit, read-only memory fabricated with MOS technology including a novel buffer circuit is described. Numerous specific details such as specific circuits, conductivity types, dopant levels, etc., are disclosed in the following specification to provide a thorough understanding of the invented concepts. It will be obvious to one skilled in the art, however, that these invented concepts may be used in other embodiments. In some instances, well-known circuits have not been described in detail in order not to complicate this specification.

In its presently preferred embodiment the PROM is fabricated on a monocrystalline silicon substrate and includes 16,384 memory cells (16K). The memory is organized in a 2K × 8 arrangement, thus 11 address bits are required to access an eight-bit word. Access times of approximately 450 nanoseconds with programming times of approximately 50 milliseconds (per eight-bit word) are obtainable. The memory is erased by subjecting it to ultraviolet radiation. All memory inputs and outputs are TTL compatible in the presently preferred embodiment. A single 5 volt power supply is employed during programming and an additional high voltage power supply (25 volts) is needed for programming.

Figure 1:
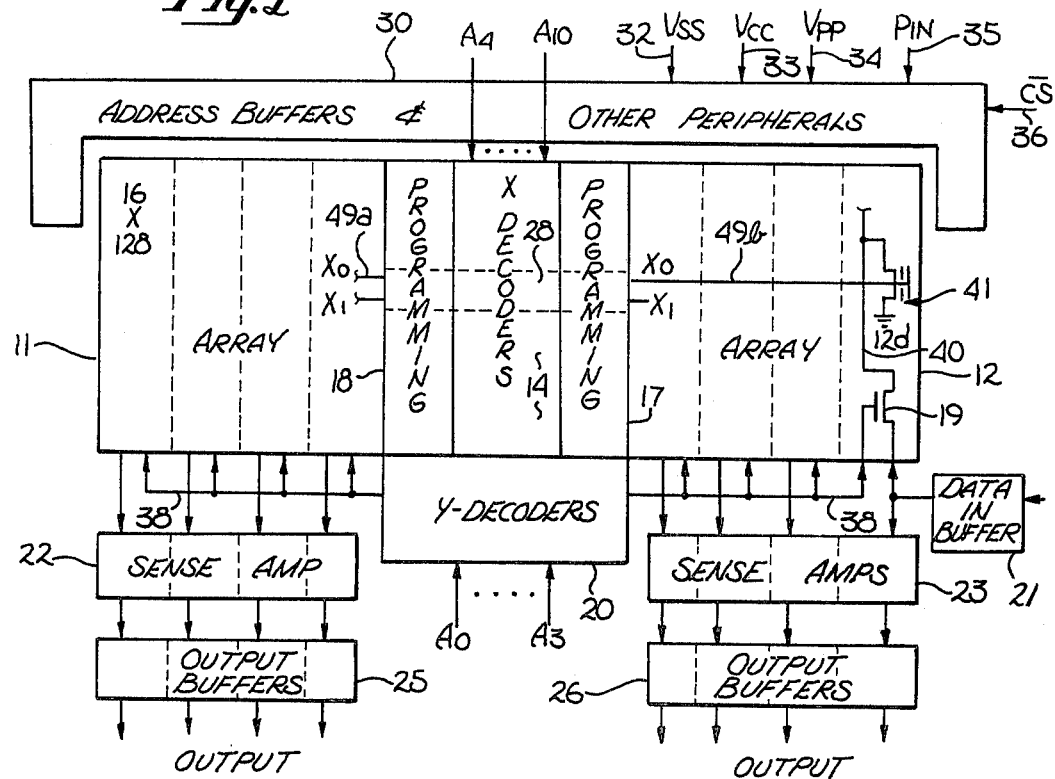
FIG. 1 is a block diagram of an invented memory employing the buffer circuit of the present invention.

Each memory cell such as cell 41 of FIG. 1 includes a source and drain terminal disposed in the substrate, a first level of polycrystalline silicon used to define a floating gate, and a second level of polycrystalline silicon, which acts as a control gate. This second level silicon forms the X-lines or row lines in the memory array, such as line 49b of FIG. 1. Each cell requires approximately 0.7 mils$^2$ of substrate area. The floating gate of the cell is negatively charged for one binary state and is neutral (no charge) for the other binary state. When a potential of +5 volts is applied to the control gate of the cell, the cell has a voltage threshold of approximately 1.8 volts if no charge exists on the floating gate, and a voltage threshold of approximately 9 volts if the floating gate is charged. When zero volts is applied to the control gate, the cells do not conduct, thus selection transistors are not required in the array for each cell. To program a cell a potential of 25 volts is applied to the control gate and a potential of 16 volts is applied to the drain terminal. The source terminal, and bulk are coupled to ground. For this condition, hot electrons from the substrate penetrate the oxide separating the floating gate from the channel and remain trapped in the floating gate since the floating gate is completely surrounded by oxide. The process employed to fabricate the memory cells is described in a copending application entitled "Self Aligning Double Polycrystalline Silicon Etching Process", Ser. No. 626,859, filed Oct. 29, 1975. The specific cell employed in the presently preferred embodiment is described in a copending application entitled "Floating Gate Storage Device", Ser. No. 714,879 filed Aug. 16, 1976. Both these applications are assigned to the assignee of the present application.

The entire memory is fabricated on a p-type silicon substrate and includes n-channel, field-effect devices which employ polycrystalline silicon gates. In the presently preferred embodiment, the substrate is doped to a level of approximately 5 × 10$^{14}$ atoms/cm$^3$. Known "front end" processing steps are employed which include the formation of field oxides and channel stops, which stops are defined with boron implantation. The regions of the substrate upon which the memory cells are fabricated are boron implanted to a concentration level of approximately 2 × 10$^{16}$ atoms/cm$^3$. Simultaneously with the implantation of these regions, other regions of the substrate which are used for the fabrication of field-effect transistors, are also implanted.

Four field-effect transistor types are employed in the peripheral circuits of the memory. These transistors differ in that each has a different threshold voltage. The first transistor type is a somewhat standard enhancement mode transistor having a threshold voltage of approximately 0.7 volts. These transistors are shown in the drawings with the standard enhancement mode, field-effect transistor symbol, such as transistors 44, 45 and 46 of FIG. 2. A shallow boron implant is used in the channel regions of these transistors to provide this threshold; the gates of these transistors are formed with the second level polycrystalline silicon and are separated from the substrate by approximately 1,000Å of oxide.

The second transistor type is a somewhat standard depletion mode transistor having a threshold voltage of approximately −3.0 volts. These devices are shown in the drawings by the symbol used, by way of example, for transistors 70, 71, 72, and 73 of FIG. 2. The channel regions of these devices are implanted with arsenic to obtain this threshold voltage; the second level silicon layer is employed to define the gates of these devices.

The third transistor type is a weak depletion mode transistor, that is, a transistor having a threshold voltage of approximately −0.2 volts. These transistors are employed in the output buffer (see transistors 106 and 109 of FIG. 3 for the symbol designation). The p-type substrate provides this threshold voltage without implanting the channel region; the gates of these devices are formed from the first level of polycrystalline silicon and are separated from the substrate by approximately 700Å of oxide.

The fourth transistor type is a high threshold, enhancement mode transistor having a threshold voltage of approximately 1.3 volts. The channel regions of these devices are ion implanted with boron simultaneously with the implantation of the host regions for the memory cells. These devices are used in the sense amplifier (see transistors 81, 84 and 89 of FIG. 3 for symbol designation). The gates of these devices are separated from the substrate by approximately 700Å of oxide.

Referring to FIG. 1, the memory array is divided into two equal parts, array 11 and array 12. Each array includes 128 X-lines (row lines) and 64 transverse (column lines) Y-lines. The X-decoders 14 are disposed generally between arrays 11 and 12. Address buffers and other peripheral circuits are generally included within the block 30. The Y-decoders 20 communicate with the Y-lines in arrays 11 and 12 through lines 38. The output data of array 11 is coupled to four sense amplifiers 22, these amplifiers, in turn, are coupled to four output buffers 25. Similarly, the output of array 12 is coupled to the sense amplifiers 23, which amplifiers are coupled to the output buffers 26.

The inputs to the memory include the address signals $A_0$ through $A_{10}$. These address signals allow the selection or programming of an eight-bit word. The data-in buffers (eight buffers) such as buffer 21, are selectively coupled by the Y-decoders to the Y-lines in the array such as line 40, during programming. The memory is powered with a 5 volt potential ($V_{CC}$) which is applied to line 33. This is the only potential required during reading. The ground for the memory is identified as $V_{SS}$, line 32. During programming a 25 volt potential is coupled to line 34, this potential is identified as $V_{PP}$. Line 35 receives a programming signal during programming, this line is also used during non-programming to receive a power-down signal. The memory is selected by a signal applied to line 36; this chip select signal ($\overline{CS}$) is used by the memory to generate chip enable signals (CE and $\overline{CE}$).

Each of the arrays 11 and 12 is divided into four subarrays each of which includes 16 Y-lines and 128 X-lines such as sub-array 12d. The Y-decoders 20 receive buffered address signals $A_1$ through $A_3$ and their complements in order that a single Y-line in each of these sub-arrays may be coupled to a sense amplifier during reading. (The $A_0$ and $\overline{A_0}$ address signal is also employed as will be described.) The Y-line 40 of sub-array 12d is coupled to the drain terminal of the memory cell 41 and to a plurality of other drain terminals of the other memory cells located along line 40. Line 40 is selectively coupled to one of the sense amplifiers 23 through transistor 19 when the Y-decoders receives the predetermined address signals. Ordinary decoding circuits may be employed for the Y-decoders, or a circuit similar to the X-decoder of FIG. 2 may be employed. In the presently preferred embodiment, the $A_0$ and $\overline{A_0}$ address signals are used to control transistors which are coupled in series along the Y-lines. Two such transistors (transistors 91 and 92) are shown in FIG. 3 coupling Y-lines to a sense amplifier.

Each of the X-decoders 28 receive the address signals $A_4$ through $A_{10}$ (or their complements); each decoder receives both the $A_4$ signal and the $\overline{A_4}$ signal. In the presently preferred embodiment, each decoder is employed for selecting two pairs of lines. For example, decoder 28 provides an output signal $X_0$, which is used to activate cells along line 49a in array 11 and along line 49b in array 12. The decoder 28 also provides the $X_1$ signal which signal activates cells in both arrays 11 and 12. Thus, 64 X-decoders are employed in the memory of FIG. 1. Programming circuitry is included with each of the X-decoders (and Y-decoders) for providing the programming potentials required along the X-lines (25 volts) and Y-lines (16 volts) for programming.

Figure 3:
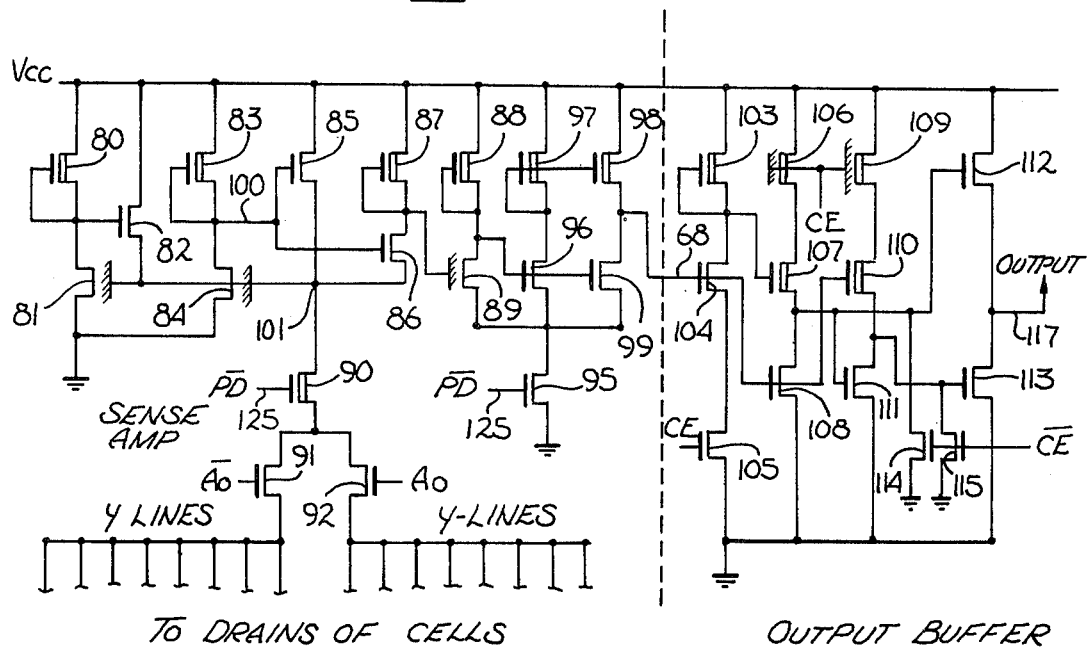
FIG. 3 is a schematic of a sense amplifier and the invented buffer employed in the memory of FIG. 1.
Figure 4:
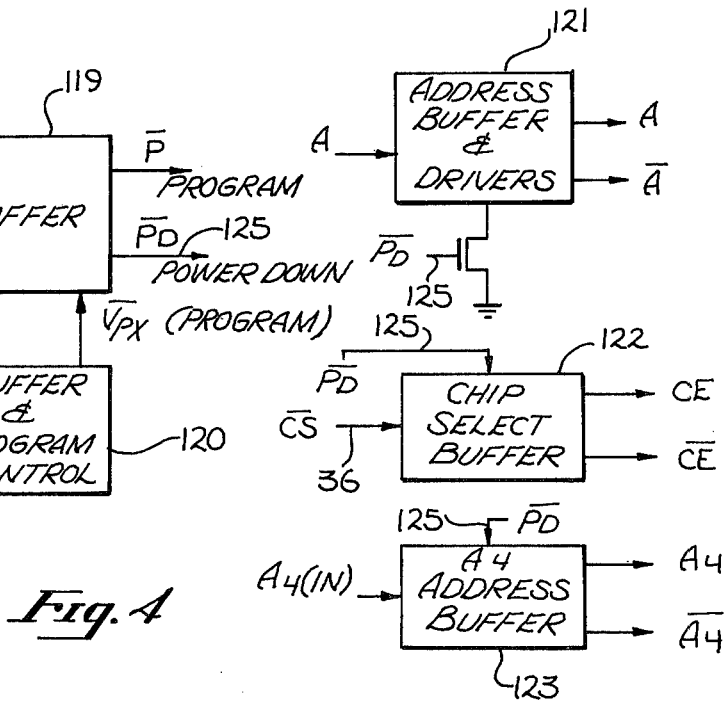
FIG. 4 is a block diagram of various portions of the memory of FIG. 1 used to describe the power-down mode of the memory.

An X-decoder such as decoder 28 will be described in detail in conjunction with FIG. 2. In FIG. 3 a sense amplifier, and output buffer such as are employed in sense amplifiers 22 and 23, and output buffers 25 and 26 will be described in detail. In FIG. 4 the power-down mode of the memory will be described including its interaction with various circuits in the memory. Well-known circuits may be employed for the remainder of the memory such as for the address buffers, data-in buffers and other peripheral circuits.

Figure 2:
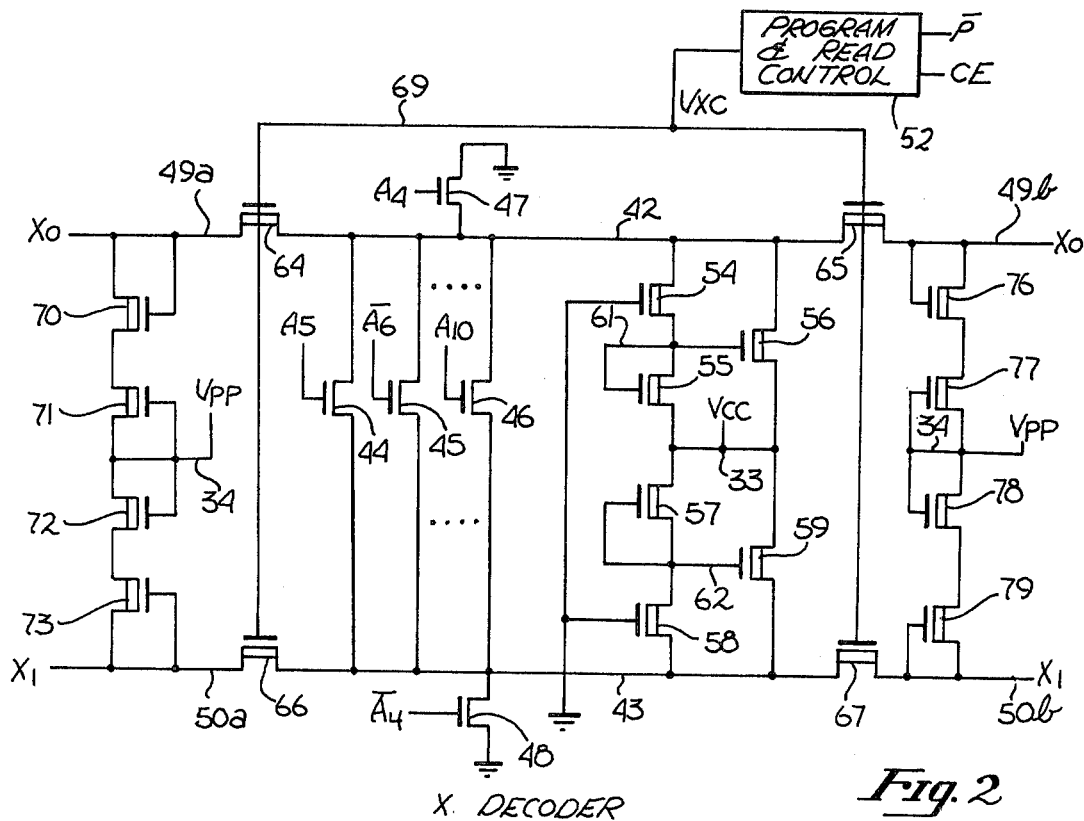
FIG. 2 is a schematic of an X-decoder employed in the memory of FIG. 1.

The decoder of FIG. 2 includes a decoding section (transistors 44, 45, 46, 47 and 48) and a programming section for providing the higher programming voltage (transistors 70 through 73 and transistors 76 through 79). The decoding section and programming section are each coupled through coupling transistors (transistors 64, 65, 66 and 67). Two pull-up means are employed; one for charging node 42 (transistors 54, 55 and 56) and the other for charging node 43 (transistors 57, 58 and 59).

In the decoding section, transistors 44, 45 and 46 are coupled in parallel between nodes 42 and 43. For the described memory each of the address bits $A_5$ through $A_{10}$ (or their complements) are coupled to transistors, such as transistors 44, 45 and 46, thus three additional transistors (not illustrated) are coupled between nodes 42 and 43. Node 42 is coupled to ground through transistors 47 which transistor has its gate coupled to receive the $A_4$ signal. Node 43 is coupled to ground through transistor 48 which transistor has its gate coupled to receive the $\overline{A_4}$.

In the pull-up for node 42, depletion mode transistors 54 and 55 are coupled in series between the source of the $V_{CC}$ potential, line 33, and node 42. The $V_{CC}$ potential is also coupled to this node through depletion mode transistor 56. The gate of transistor 56, node 61, is common with the gate of transistor 55 and the junction between transistors 54 and 55. The gate of transistor 54 is coupled to ground. Similarly, the pull-up for node 43 includes depletion mode transistors 57 and 58 coupled in series between line 33 and node 43, and the parallel depletion mode transistor 59. The gate of transistor 59, node 62, is coupled to the junction between transistors 57 and 58, and the gate of transistor 57. The gate of transistor 58 is coupled to ground.

Node 42 is coupled to one pair of X-lines in the array (lines 49a and 49b) through transistor 64 and transistor 65, respectively. Similarly, node 43 is coupled to another pair of lines (lines 50a and 50b) through transistors 66 and 67, respectively. These four depletion mode transistors have their gates coupled to line 69 which line receives a signal designated as $V_{XC}$.

Line 49b is coupled to the source of the $V_{PP}$ potential, line 34, through the series depletion mode transistors 76 and 77. Transistor 76 has its gate coupled to line 49b. Similarly, line 50b is coupled to the $V_{PP}$ potential through transistor 78 and 79. At the other side of the decoder, line 49a is coupled to line 34 through the series transistors 70 and 71, and line 50a is coupled to line 34 through the series transistors 72 and 73. Transistors 70, 71, 72, 73, 76, 77, 78 and 79 are depletion mode transistors.

In operation only one line pair in all the X-decoders, such as lines 49a and 49b or 50a and 50b are not coupled to ground for any combination of the address signals $A_4$ through $A_{10}$ and their complements. For example, for one predetermined combination of address signals, transistors 44, 45 and 46 do not conduct. If $A_4$ is high then node 42 is coupled to ground through transistor 47, and node 43 is not coupled to ground. On the other hand, if $\overline{A_4}$ is high, then node 42 is not coupled to ground while node 43 is coupled to ground through transistor 48. Each of the X decoders of decoders 14 of FIG. 1 employs the $A_4$ and $\overline{A_4}$ signal in the same manner as is shown in FIG. 2. The reason for this, as will be explained in more detail, is to permit all the X-decoders to be easily powered-down.

Assume for sake of discussion that the address applied to the memory is such that node 42 is not coupled to ground. Transistor 55 charges the gate of transistor 56 causing this transistor to conduct heavily. Transistor 56 is used to quickly charge the high capacitance associated with the lines 49a and 49b. As node 42 rises in potential, transistor 54 is prevented from conducting since its gate is coupled to ground. Thus, node 42 and line 49a and 49b are quickly charged through transistor 56. With respect to node 43, this node is coupled to ground through transistor 48. Since the source terminal and gate of transistor 58 are at ground, this depletion mode transistor conducts preventing node 62 from charging to $V_{CC}$. This prevents a large flow of current through the transistor 59. If one of the transistors 44, 45 or 46 conducts, both nodes 42 and 43 are coupled to ground.

The $V_{XC}$ signal is generated by the program and read control means 52. This means receives the $\overline{P}$ signal and the CE signal. The $V_{XC}$ signal is equal to $V_{CC}$ (5 volts) during reading and is equal to $V_{SS}$ (ground) during programming. During reading the transfer transistors 64 and 65 allow a positive potential on node 42 to be transferred to lines 49a and 49b.

Referring to the programming section of the decoder, during reading $V_{PP}$ is at ground potential, thus a path exists through transistors 76 and 77 to ground when line 49b is selected. However, transistor 77 prevents any substantial discharge of line 49b through transistors 76 and 77 since the source and gate of this relatively small transistor are at ground.

Assume that the memory is being programmed and that the address applied to the memory causes lines 49a and 49b to be selected. For this condition node 42 is again brought to $V_{CC}$ through transistor 56. The $V_{XC}$ potential is at ground potential, thus the source terminal of transistor 65 is at 5 volts while its gate is grounded cutting-off this transistor. Transistors 76 and 77 charge line 49b to the $V_{PP}$ potential (approximately 25 volts). Similarly, transistors 70 and 71 charge the line 49a to the $V_{PP}$. Since node 42 is charged, node 43 is at ground. A path from $V_{PP}$ to ground exists through transistors 78 and 79, and transistors 72 and 73. However, with the gates of transistors 73 and 79 at ground, these relatively small transistors limit the flow of current from $V_{PP}$.

A significant feature of the decoder of FIG. 2 is that the transfer transistors 64, 65, 66 and 67 prevent the high programming potential ($V_{PP}$) from being applied to the transistors in the decoding section. For example, when lines 49a and 49b are selected and $X_0$ rises to $V_{PP}$, transistors 64 and 65 are cut-off preventing $V_{PP}$ from being coupled to transistors in the decoding section. If lines 49a and 49b are not selected, the high voltage drop associated with transistors 70 and 76 prevents high potentials from being coupled to any of the transistors in the decoding section. Since a high potential is never applied to the transistors in the decoding section, these transistors may be fabricated with relatively short channels. Referring to FIG. 1 each memory cell is approximately 20 microns wide. Thus, to permit the layout of FIG. 1, each decoder such as decoder 28, may only be 40 microns wide. This width limitation for the decoders is made possible primarily since the high voltage needed for programming does not enter the decoding sections of the decoders.

In FIG. 3 a sense amplifier is illustrated with its output, line 68, coupled to the input of an output buffer. The input to the sense amplifier, node 101, may be coupled to one of 16 Y-lines in the array through a depletion mode transistor 90 and through either transistors 91 or 92. Each one of the 16 Y-lines includes selection transistors which are operated by the output of the Y-decoders (such as transistor 19 of FIG. 1). Transistor 90 has its gate coupled to the source of the $\overline{PD}$ signal and thus provides decoupling during the power-down mode and programming mode.

When a cell is coupled to node 101 and the cell's floating gate is not charged, the cell conducts current in the order of 20 micro amps. This current and the resultant drop in potential on node 101 is sensed by the sense amplifier. Transistor 86 primarily performs this sensing function and provides an output to an inverter which comprises transistors 88 and 89. The depletion mode transistor 87 is the primary pull-up device for the column lines. The transistors 83 and 84 are used to clamp node 100, that is, the gate of transistor 86, as will be described in more detail. The transistor 85 provides leakage current for the Y-lines; its gate is also controlled by the potential on node 100. Transistors 80, 81 and 82 are used to prevent the potential on node 101 from dropping below a predetermined level and to pull-up the column lines. In practice the voltage swing at node 101 is approximately 200 millivolts which is amplified to approximately 2 volts at the gate of transistor 89. Transistors 88, 89, 96, 97, 98 and 99 all form an amplification stage at the output of the sense amplifier.

The primary sensing means of the sense amplifier of FIG. 3, transistor 86, has its source terminal coupled to node 101 and its drain terminal coupled to the depletion mode (pull-up) transistor 87. The gate of the depletion mode transistor 87 is coupled to the gate of the high threshold, enhancement mode transistor 89 and to the junction between transistors 86 and 87. The clamping potential on node 100, the gates of transistors 85 and 86, is derived from the common junction between the series coupled depletion mode transistor 83 and the high threshold, enhancement mode transistor 84. The gate of transistor 84 is coupled to node 101 and the gate of the high threshold, enhancement mode transistor 81. The depletion mode transistor 80 and transistor 81 are coupled in series between $V_{CC}$ and ground. The common junction between these transistors which includes the gate of transistor 80 is coupled to the gate of transistor 82. The source terminal of transistor 82 is coupled to node 101.

The inverter stage includes the depletion mode transistor 88 which is coupled in series with the high threshold, enhancement mode transistor 89. These transistors are coupled to ground through transistor 95. The gate of transistor 88 along with the common junction between transistors 88 and 89 are coupled to the gates of transistors 96 and 99. The depletion mode transistor 97 and the enhancement mode transistor 96 are coupled in series between $V_{CC}$ and the drain terminal of transistor 95. The depletion mode transistor 98 and transistor 99 are also coupled in series between $V_{CC}$ and the drain terminal of transistor 95. The gates of transistors 97 and 98 are coupled to the junction between transistors 96 and 97. As may be readily seen from FIG. 3 transistor 95 is employed to prevent the flow of current through transistors 88, 89, 96, 97, 98 and 99 during the power-down mode.

Assume for sake of discussion that node 101 is coupled to the drain terminal of a floating gate memory cell, and that the floating gate is not charged. For this condition the cell will conduct. As current flow through the cell to ground the potential on node 101, the source terminal of transistor 86, will drop. This drop in potential causes transistor 86 to conduct more heavily, which in turn causes the potential at the gate of transistor 89 to drop. On the other hand, if node 101 were coupled to a cell which does not conduct, the potential on node 101 will not drop and transistor 86 will not conduct. For this condition the potential on the gate of transistor 89 rises.

The clamping circuit regulates the voltage on the gate of transistor 86 so as to enhance the sensing function of this transistor. For example, if the potential on node 101 drops it causes transistor 84 to conduct less. The potential on node 100 then rises since this node is coupled to $V_{CC}$ through the depletion mode transistor 83. With this rise in potential, transistor 86 conducts more heavily, thereby providing a greater drop in potential at the gate of transistor 89. If, however, node 101 rises in potential, transistor 84 conducts more heavily and the potential on node 100 drops. Transistor 86 then conducts less, thereby causing the gate of transistor 89 to rise in potential.

Transistor 84 has a higher threshold voltage than transistor 86 (1.3 volts compared to 0.7 volts) and thus transistor 84 operates in a generally linear region. Moreover, both the channel regions of the cells and the high threshold, enhancement mode transistors such as transistor 84, are simultaneously implanted and their source and drain regions are formed in alignment with the same (first level) silicon layer. Processing variations, therefore, effect the cells and these transistors in the same manner. Thus, transistor 84 compensates for process variations. By way of example, assume that the cells have a higher than normal threshold. Node 101 would then not discharge as quickly when coupled to a conducting cell. Transistor 84 also will have a higher threshold and will not conduct as readily. This causes the potential on node 100 to rise, thereby providing a compensating (higher) potential on the gate of transistor 86. Similarly, if the threshold voltage of the cells are lower, then a (lower) compensating potential is applied to the gate of transistor 86. Transistor 85 also receives the compensated voltage on node 100.

If the potential on node 101 drops below a predetermined level, transistor 81 conducts less and the potential on the gate of transistor 82 rises providing current for the column lines through transistor 82. In this manner transistor 82 prevents node 101 from dropping below a predetermined potential and also provides a means for quickly charging the capacitance associated with the unselected column lines. Transistor 82 precharges the column lines to a first potential and then cuts-off allowing transistor 87 to complete the charging of the lines. Again as in the case of transistor 84, the high voltage, enhancement mode transistor 81 provides compensation for process variations.

The inverter stage comprising transistors 88 and 89 has a "trip" point which is a function of the ratio of these devices. Also, this trip point is a function of process variations and transistor 89 provides compensation for these variations. The amplification stage comprising transistors 96, 97, 98 and 99 operates in a known manner to provide an output of the sense amplifier on line 68.

The output buffer of FIG. 3 is a standard buffer, except for the use of transistors 106 and 109, and includes two inverter stages which are used to drive an output push-pull stage. The depletion mode transistor 103 is coupled between $V_{CC}$ and ground through transistors 104 and 105. The gate of transistor 103 is coupled to the common junction between transistors 103 and 104 and the gate of transistor 107. The input to the output buffer, line 68, is coupled to the gate of transistor 104 and also to the gates of transistors 108 and 110. Transistor 105 has its gate coupled to the source of the CE signal and thus prevents a flow of current through transistors 103 and 104 when the chip is deselected and during the power-down mode. Transistors 106, 107 and 108 are coupled in series between $V_{CC}$ and ground. Similarly, transistors 109, 110 and 111 are also coupled between $V_{CC}$ and ground. The output of one of the inverters, the junction between transistors 107 and 108 is coupled to the gate of transistor 111 and to the gate of transistor 112. The output of the other inverter, the junction between transistors 110 and 111 is used to drive transistor 113. Both the gates of transistors 106 and 109 are coupled to the source of the CE signal. The gates of transistors 112 and 113 are coupled to ground through transistors 114 and 115, respectively. The gates of transistors 114 and 115 are coupled to the source of the $\overline{CE}$ signal. Thus, when $\overline{CE}$ is positive, the output line 117 which is coupled to the common junction between the series output transistors 112 and 113, electrically floats.

Transistors 106 and 109 are weak depletion transistors (−0.2 threshold voltage). During the time that CE is low, which also includes the power-down period, transistors 106 and 109 reduce the power consumption of the output stage. Note that if enhancement mode transistors were used for this application they would have a significant voltage drop when conducting and would prevent a high output potential on line 117. If standard depletion mode transistors were used in this application substantial power would be consumed. Also the gate-to-source capacitance of transistor 112 bootstraps the gate of this output transistor to above $V_{CC}$. This is possible since the low threshold transistor 109 is cut-off as the potential on the gate of transistor 112 rises above $V_{CC}$. Thus the low threshold transistor improves the speed of the output buffer.

Referring to FIG. 4 various portions of the memory are shown in order to describe the power-down mode of operation. During the power-down mode numerous circuits in the memory are turned-off to reduce power consumption. The power-down signal is received on line 35, the same line used for the programming signal. If the power-down signal is high (without the presence of the programming potential on line 34) the power-down mode is activated. If this signal is high with the presence of $V_{PP}$, then programming occurs.

The $V_{PP}$ potential, line 34, is coupled to a buffer and program control logic means 120. The outputs of this means are $V_{PX}$ and $\overline{V_{PX}}$; the $V_{PX}$ signal is high during reading and the $\overline{V_{PX}}$ signal is high during programming. These signals are used by various circuits in the memory and are also coupled to buffer 119. Buffer 119 also receives the $P_{IN}$ signal (line 35). The outputs of buffer 119 are the programming signal, $\overline{P}$, and the power-down signal ($\overline{PD}$), line 125. Ordinary logic means are used for buffer 119 and the control means 120. Note that by employing the $P_{IN}$ signal both as a power-down signal and a programming signal, one input pin to the memory is saved in addition to a buffer.

Each address buffer and driver 121 (except the $A_4$ buffer) is coupled to ground through a transistor which has its gate coupled to line 125. Thus, each of the buffers and drivers 121 of FIG. 3 are decoupled from ground during the power-down mode, thereby conserving power.

The power-down signal is also coupled to the chip select buffer 122. When the $\overline{PD}$ signal is low, the $\overline{CE}$ signal is high and the CE signal is low, independent of the input on line 36. These signals, as may be seen in FIG. 3, prevent conduction through transistors 103 and 104, reduce the current through the inverters by decreasing the conduction through transistors 106 and 109, and allow the output line 117 to float since transistors 114 and 115 conduct.

The $\overline{PD}$ signal is also coupled to the $A_4$ address buffer 123. When the $\overline{PD}$ signal is low, both the $A_4$ and the $\overline{A_4}$ outputs of this buffer are low, independent of the input to this buffer. This prevents any flow of current to ground through transistors 47 and 48 of FIG. 2, and like transistors in the other X-decoders.

Worse case power consumption during reading is approximately 750 milliwatts for the 16 K PROM. In the power-down mode power consumption is cut to less than 100 milliwatts.

Thus, a PROM which may be erased with ultraviolet radiation has been described. A plurality of MOS devices having different voltage thresholds are employed to obtain a number of improved circuits. A power-down mode is incorporated within the memory to conserve power.

We claim:

1. A stage for a metal-oxide-semiconductor (MOS) buffer comprising:
    an enhancement mode, field-effect transistor having a gate coupled to receive an input signal for said stage;
    a load coupled in series with said enhancement mode transistor for providing an output signal from said stage between said enhancement mode transistor and said load;
    a second field-effect transistor having a threshold voltage approximately equal to zero volts, said second transistor coupled in series with said enhancement mode transistor and said load, the gate of said second transistor coupled to receive a timing signal;
    whereby, by the application of said timing signal to said gate of said second transistor, substantially no voltage drop loss occurs in said stage across said second transistor, and whereby, when said timing signal is removed from said gate of said second transistor, current flow in said stage is reduced, thereby reducing the power consumed by said stage.

2. The MOS buffer stage defined by claim 1 wherein said load comprises a depletion mode transistor.

3. In a metal-oxide-semiconductor (MOS) buffer which includes a depletion mode transistor coupled in series with an enhancement mode transistor where the gate of said enhancement mode transistor is coupled to receive an input signal, an improvement comprising:
    a field-effect transistor having a threshold voltage approximately equal to zero volts coupled in series with said enhancement mode transistor and said depletion mode transistor;
    whereby, by the selective application of a timing signal to the gate of said field-effect transistor, power in said buffer is reduced without substantially effecting the performance of said buffer.

* * * * *